(12) United States Patent
Ikeda

(10) Patent No.: US 6,741,516 B2
(45) Date of Patent: May 25, 2004

(54) SEMICONDUCTOR MEMORY

(75) Inventor: Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/379,563

(22) Filed: Mar. 6, 2003

(65) Prior Publication Data

US 2004/0042311 A1 Mar. 4, 2004

(30) Foreign Application Priority Data

Aug. 28, 2002 (JP) ........................................ 2002-249436

(51) Int. Cl.$^7$ ................................................ G11C 7/00
(52) U.S. Cl. ................... 365/222; 365/189.07; 365/194
(58) Field of Search ............................ 365/222, 189.07, 365/194

(56) References Cited

U.S. PATENT DOCUMENTS 6,233,193 B1 * 5/2001 Holland et al. ............. 365/222
6,611,470 B2 * 8/2003 Hidaka ....................... 365/222
2003/0026161 A1 * 2/2003 Yamaguchi et al. ........ 365/222

* cited by examiner

Primary Examiner—Huan Hoang
(74) Attorney, Agent, or Firm—Arent Fox, PLLC

(57) ABSTRACT

A semiconductor memory that shortens refresh operation time. A REF-ACT comparison circuit for addresses compares a refresh request signal srtz and an active request signal atdpz and immediately outputs a refresh address import signal ialz to a row-add latch circuit in the case of the refresh request signal srtz having been input prior to the active request signal atdpz. A REF-ACT comparison circuit for commands compares a delayed refresh request signal srtdz obtained by delaying the refresh request signal srtz and the active request signal atdpz, outputs a refresh execution request signal refpz in the case of the delayed refresh request signal srtdz having been input prior to the active request signal atdpz, and outputs an active execution request signal actpz in the case of the active request signal atdpz having been input prior to the delayed refresh request signal srtdz.

5 Claims, 10 Drawing Sheets

SEMICONDUCTOR MEMORY

CROSS-REFERENCE TO RELATED APPLICATIONS

This application is based upon and claims priority of Japanese Patent Application No. 2002-249436, filed on Aug. 28, 2002, the contents being incorporated herein by reference.

BACKGROUND OF THE INVENTION (1) Field of the Invention

This invention relates to a semiconductor memory and, more particularly, to a semiconductor memory of a dynamic random access memory (DRAM) type having an asynchronous static random access memory (SRAM) interface.

(2) Description of the Related Art

In recent years, attention has been riveted to DRAMs (pseudo SRAMs) having an asynchronous SRAM interface because of low power consumption, the feasibility of large storage capacity, cheapness, and so on.

For example, Japanese Patent Laid-Open Publication No. 2002-118383 discloses a synchronous pseudo SRAM which performs refresh operation internally and automatically.

FIG. 7 is a view showing the structure of a conventional semiconductor memory of a pseudo SRAM type.

A semiconductor memory 20 comprises an ATD generation circuit 21, a REF control circuit 22, a REF-ACT comparison circuit 23, delay circuits 24a and 24b, a latch signal generation circuit 25, REF-add counters 26, input buffers 27, row-add latch circuits 28, column-add latch circuits 29, a core control circuit 30, and a memory cell array (Hereinafter referred to as core circuit) 31.

The ATD generation circuit 21 detects a change in external signal (/CE, /WE, /OE, or ADD) and generates an active request signal atdpz indicative of, for example, a read/write request. In this case, /CE, /WE, /OE, and ADD are a chip enable signal, write enable signal, output enable signal, and address signal, respectively, and are external signals.

The REF control circuit 22 includes a timer (not shown) and generates a refresh request signal srtz for periodically performing refresh operation.

The REF-ACT comparison circuit 23 compares a refresh request signal srtz and an active request signal atdpz. If the refresh request signal srtz was input prior to the active request signal atdpz, then the REF-ACT comparison circuit 23 outputs a refresh execution request signal refpz. If the active request signal atdpz was input prior to the refresh request signal srtz, then the REF-ACT comparison circuit 23 outputs an active execution request signal actpz.

The delay circuits 24a and 24b delay an active execution request signal actpz and a refresh execution request signal refpz, respectively, by time taken to define an internal address in the core circuit 31.

The latch signal generation circuit 25 outputs an external address import signal ealz in response to an active execution request signal actpz and outputs a refresh address import signal ialz in response to a refresh execution request signal refpz.

The REF-add counters 26 count up to automatically generate a refresh address rfa##z.

An address signal ADD specified by an active request is input to the input buffers 27 from the outside and the input buffers 27 output it as an external address a##z.

The row-add latch circuits 28 specify a row address in the direction of word lines (not shown) in the core circuit 31.

The column-add latch circuits 29 specify a column address in the direction of column lines (not shown) in the core circuit 31.

The core control circuit 30 controls the core circuit 31 with a core control signal corez.

The core circuit 31 is a memory cell array of a DRAM type.

FIG. 8 is a circuit diagram of a conventional REF-ACT comparison circuit.

The REF-ACT comparison circuit 23 includes inverters 300 through 310, NAND circuits 320 through 329, a pulse width expansion section 330, and delay circuits 331 through 333. The NAND circuits 321 and 322, 323 and 324, 325 and 326, and 327 and 328 makeup flip-flops FF10, FF11, FF12, and FF13 respectively. An active request signal atdpz is input to the pulse width expansion section 330 via the inverter 300. The pulse width of the active request signal atdpz is expanded here so that a period during which the active request signal atdpz is at the high level (H level) will match a period during which a core control signal corez output from the core control circuit 30 is at the H level, and is input to one input terminal of the NAND circuit 320. The core control signal corez is input to the other input terminal of the NAND circuit 320 via the inverter 301.

A refresh request signal srtz is input via the inverter 302 to one input terminal of the NAND circuit 321 included in the flip-flop FF10, and output from the NAND circuit 321 is input to one input terminal of the NAND circuit 324 included in the flip-flop FF11. Output from the NAND circuit 324 is output as a refresh execution request signal refpz via the inverter 303. Moreover, output from the inverter 303 is delayed by the delay circuit 331 and is input via the inverter 304 to one input terminal of the NAND circuit 322 included in the flip-flop FF10.

Furthermore, the output from the inverter 303 is input via the inverter 305 to one input terminal of the NAND circuit 325 included in the flip-flop FF12. The core control signal corez output from the core control circuit 30 is input to one input terminal of the other NAND circuit 326 included in the flip-flop FF12. Output from the NAND circuit 325, being output from the flip-flop FF12, is output as a refresh execution signal refz via the inverters 306 and 307. Moreover, output from the inverter 306 is input to one input terminal of the NAND circuit 329.

The active request signal atdpz is input to the delay circuit 332 via the inverter 308, is delayed by the delay circuit 332, and is input to one input terminal of the NAND circuit 327 included in the flip-flop FF13. Output from the NAND circuit 327, being output from the flip-flop FF13, is input to the other input terminal of the NAND circuit 329. Output from the NAND circuit 329 is output as an active execution request signal actpz via the inverter 309. Moreover, output from the inverter 309 is input to the delay circuit 333, is delayed there, and is input via the inverter 310 to one input terminal of the NAND circuit 328 included in the flip-flop FF13.

The delay circuit 331, inverter 304, and flip-flop FF10 shown in FIG. 8 are used for obtaining predetermined pulse width. The same applies to the delay circuit 333, inverter 310, and flip-flop FF13.

Now, operation in the conventional semiconductor memory 20 will be described with FIGS. 7 and 8.

FIG. 9 is a timing chart for describing operation performed in the conventional semiconductor memory in the case of refresh operation being performed prior to active operation.

Each arrow in FIG. 9 indicates a signal which changes in response to the rise or fall of another signal.

For example, when a chip enable signal /CE, being an external signal, is input to the ATD generation circuit 21, the ATD generation circuit 21 generates an active request signal atdpz. As shown in FIG. 9, in this case, the REF control circuit 22 generates a refresh request signal srtz before the active request signal atdpz is generated. The refresh request signal srtz and active request signal atdpz are input to the REF-ACT comparison circuit 23.

The refresh request signal srtz is at the H level, so potential at one input terminal of the NAND circuit 324 included in the flip-flop FF11 in the REF-ACT comparison circuit 23 becomes the H level. When the refresh request signal srtz goes into the H level, the active request signal atdpz and a core control signal corez are at the low level (L level). As a result, potential at one input terminal of the NAND circuit 323 included in the flip-flop FF11 becomes the L level. Therefore, output from the flip-flop FF11 goes into the L level and a refresh execution request signal refpz goes into the H level.

When the refresh execution request signal refpz goes into the H level, the latch signal generation circuit 25 generates a refresh address import signal ialz. Then a refresh address rfa##z is imported from the REF-add counters 26 and a row address ra##z where the core control circuit 30 refreshes data is specified.

Moreover, the refresh execution request signal refpz is delayed by the delay circuit 24b by time taken to define the row address ra##z in the core circuit 31 and is input to the core control circuit 30. When the core control circuit 30 receives the delayed refresh execution request signal refpz, it outputs the core control signal corez to refresh data stored in memory cells (not shown) in the core circuit 31 specified by the row address ra##z.

Data stored in memory cells connected to each of word lines (not shown) in the core circuit 31 is refreshed in block, so there is no need to specify a column address ca##z. Only a row address ra##z should be specified.

As shown in FIG. 9, it is assumed that the active request signal atdpz goes into the H level by the chip enable signal /CE just after the refresh request signal srtz being generated. If refresh operation is being performed and the core control signal corez is at the H level, a refresh execution signal refz and active execution request signal actpz are kept at the H and L levels respectively, as can be understood from FIG. 8. If the refresh execution request signal refpz goes into the L level and the core control signal corez goes into the L level, output from the flip-flop FF12 goes into the L level when the core control signal corez falls. Both the input terminals of the NAND circuit 329 go into the H level. As a result, the active execution request signal actpz goes into the H level. When the active execution request signal actpz goes into the H level, the latch signal generation circuit 25 outputs an external address import signal ealz. As a result, an external address a##z is imported from the input buffers 27 to the row-add latch circuits 28 and column-add latch circuits 29. Moreover, the active execution request signal actpz is delayed by the delay circuit 24a by time tA taken to define an address. Then the core control signal corez is put into the H level and a memory cell (not shown) specified by a row address ra##z and column address ca##z is accessed to perform active operation, such as writing or reading.

FIG. 10 is a timing chart for describing operation performed in the conventional semiconductor memory in the case of active operation being performed prior to refresh operation.

Each arrow in FIG. 10 indicates a signal which changes in response to the rise or fall of another signal.

For example, when a chip enable signal /CE, being an external signal, is input to the ATD generation circuit 21, the ATD generation circuit 21 generates an active request signal atdpz. As shown in FIG. 10, in this case, the ATD generation circuit 21 generates the active request signal atdpz before a refresh request signal srtz is generated. The refresh request signal srtz, the active request signal atdpz, and a core control signal corez are input to the REF-ACT comparison circuit 23.

When the active request signal atdpz is input to the REF-ACT comparison circuit 23, potential at one input terminal of the NAND circuit 323 included in the flip-flop FF11 shown in FIG. 8 becomes the H level. At this time, potential at one input terminal of the NAND circuit 324 included in the flip-flop FF11 becomes the L level, so output from the flip-flop FF11 goes into the H level. As a result, a refresh execution request signal refpz is kept at the L level and an active execution request signal actpz goes into the H level.

When the active execution request signal actpz goes into the H level, the latch signal generation circuit 25 generates an external address import signal ealz. As a result, an external address a##z is imported from the input buffers 27. The row-add latch circuits 28 and column-add latch circuits 29 specify a row address ra##z and column address ca##z respectively. Moreover, the active execution request signal actpz is delayed by the delay circuit 24a by time tA taken to define an internal address in the core circuit 31 and is input to the core control circuit 30. When the core control circuit 30 receives the active execution request signal actpz, it generates the core control signal corez and accesses a memory cell (not shown) in the core circuit 31 specified by the row address ra##z and column address ca##z to perform active operation, such as reading or writing.

As shown in FIG. 10, when the active operation is completed and the core control signal corez goes into the L level, the refresh execution request signal refpz goes into the H level in synchronization with the fall of the core control signal corez. When the refresh execution request signal refpz goes into the H level, the latch signal generation circuit 25 outputs a refresh address import signal ialz. As a result, the row-add latch circuits 28 import a refresh address rfa##z from the REF-add counters 26 to specify a row address ra##z.

Moreover, the refresh execution request signal refpz is delayed by the delay circuit 24b by time (tA) taken to define an internal address in the core circuit 31 and is input to the core control circuit 30. When the core control circuit 30 receives the delayed refresh execution request signal refpz, it outputs the core control signal corez to refresh data stored in memory cells (not shown) in the core circuit 31 specified by the row address.

As stated above, with the conventional semiconductor memory 20, a request for active operation, such as writing or reading, and a request for refresh operation are compared. If the request for refresh operation was made prior to the request for active operation, refresh operation is selected and then a refresh address is imported. That is to say, there is delay time tA between the selection of refresh operation and the definition of an internal address in the core circuit 31. This delays the refresh operation. Therefore, the active operation to be performed following the refresh operation is also delayed.

SUMMARY OF THE INVENTION

The present invention was made under the background circumstances as described above. An object of the present invention is to provide a semiconductor memory which can shorten refresh time.

In order to achieve the above object, a dynamic semiconductor memory having an asynchronous static semiconductor memory interface is provided. This semiconductor memory comprises a first comparison circuit for comparing a refresh request signal generated internally for performing refresh operation and an active request signal input from the outside for performing active operation and for immediately outputting a refresh address import signal in the case of the refresh request signal having been generated prior to the active request signal and a second comparison circuit for comparing a delayed refresh request signal obtained by delaying the refresh request signal by predetermined time and the active request signal, for outputting a refresh execution request signal in the case of the delayed refresh request signal having been input prior to the active request signal, and for outputting an active execution request signal in the case of the active request signal having been input prior to the delayed refresh request signal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENT

An embodiment of the present invention will now be described with reference to the drawings.

Figure 1:
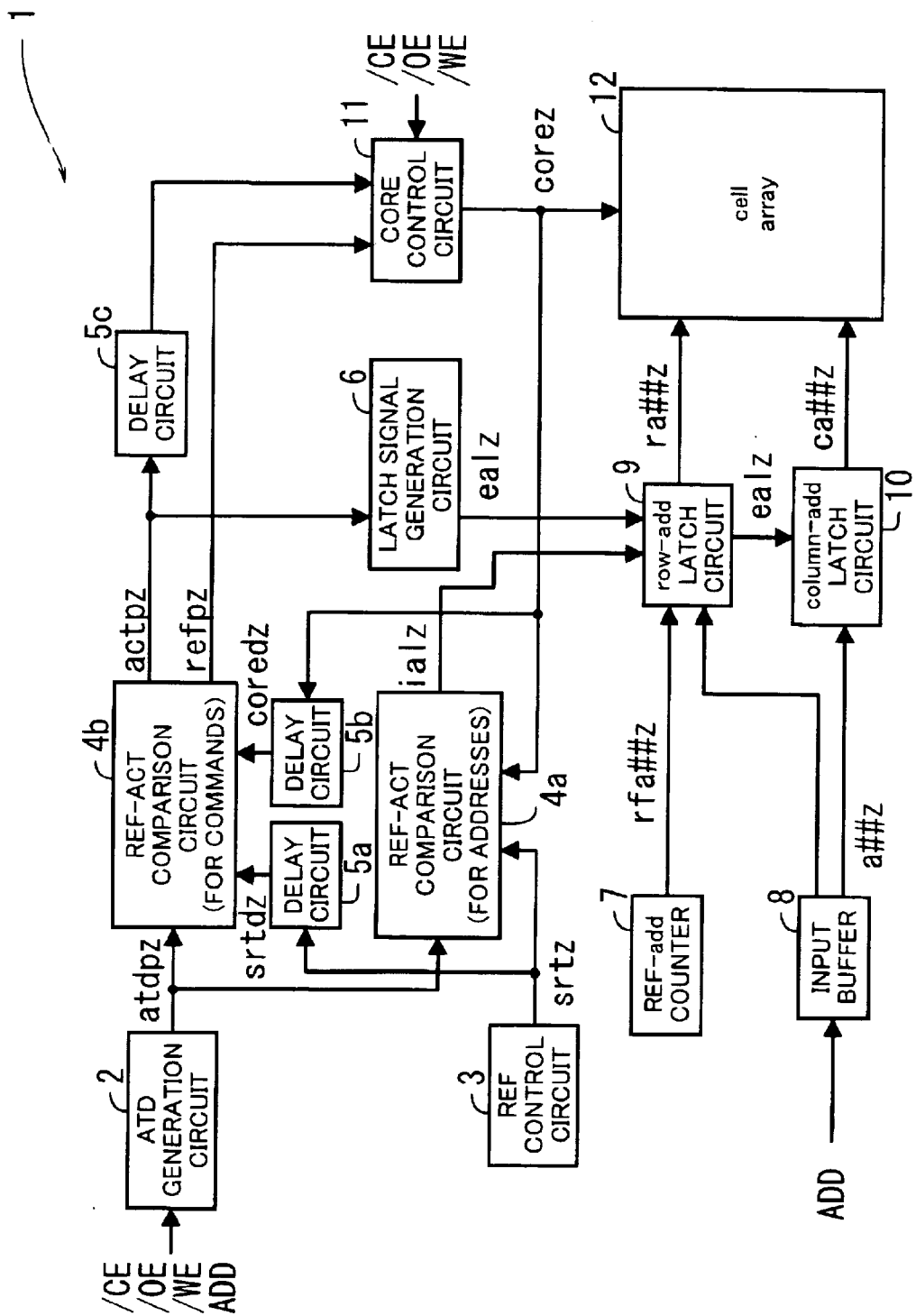
FIG. 1 is a view showing the structure of a semiconductor memory according to an embodiment of the present invention.

FIG. 1 is a view showing the structure of a semiconductor memory according to an embodiment of the present invention.

A semiconductor memory 1 comprises an ATD generation circuit 2, a REF control circuit 3, REF-ACT comparison circuits 4a and 4b, delay circuits 5a through 5c, a latch signal generation circuit 6, REF-add counters 7, input buffers 8, row-add latch circuits 9, column-add latch circuits 10, a core control circuit 11, and a memory cell array (core circuit) 12 and has DRAM structure with an asynchronous SRAM interface in which refresh operation is performed internally and automatically.

The ATD generation circuit 2 detects a change in external signal (/CE, /WE, /OE, or ADD) and generates an active request signal atdpz indicative of, for example, a read/write request.

In this case, /CE, /WE, /OE, and ADD are a chip enable signal, write enable signal, output enable signal, and address signal respectively.

The REF control circuit 3 includes a timer (not shown) and generates a refresh request signal srtz periodically.

The REF-ACT comparison circuit 4a for addresses compares a refresh request signal srtz and an active request signal atdpz. If the refresh request signal srtz was input prior to the active request signal atdpz, then the REF-ACT comparison circuit 4a for addresses immediately outputs a refresh address import signal ialz to the row-add latch circuits 9.

The REF-ACT comparison circuit 4b for commands compares a delayed refresh request signal srtdz obtained by delaying a refresh request signal srtz and an active request signal atdpz. If the delayed refresh request signal srtdz was input prior to the active request signal atdpz, then the REF-ACT comparison circuit 4b for commands outputs a refresh execution request signal refpz. If the active request signal atdpz was input prior to the delayed refresh request signal srtdz, then the REF-ACT comparison circuit 4b for commands outputs an active execution request signal actpz.

The delay circuit 5a delays a refresh request signal srtz by time taken to define an internal address in the core circuit 12.

The delay circuit 5b delays a core control signal corez to generate a delayed core control signal coredz.

The delay circuit 5c delays an active execution request signal actpz by time taken to define an internal address in the core circuit 12.

The latch signal generation circuit 6 receives an active execution request signal actpz and outputs an external address import signal ealz for importing the external address of a memory to be accessed.

The REF-add counters 7 count up to automatically generate a refresh address rfa##z.

An address signal ADD specified by an active request is input to the input buffers 8 from the outside and the input buffers 8 output it as an external address a##z.

The row-add latch circuits 9 receive a refresh address import signal ialz or an external address import signal ealz, select a refresh address rfa##z or an external address a##z, and specify it as a row address ra##z in the direction of word lines (not shown) in the core circuit 12.

The column-add latch circuits 10 receive an external address import signal ealz, import an external address a##z, and specify a column address ca##z in the direction of column lines (not shown).

The core control circuit 11 receives a refresh execution request signal refpz or an active execution request signal actpz and generates a core control signal corez for accessing the core circuit 12. The core control signal corez is sent both to the REF-ACT comparison circuit 4a for addresses and to the REF-ACT comparison circuit 4b for commands via the delay circuit 5b.

The core circuit 12 is a memory cell array of a DRAM type.

The semiconductor memory 1 according to the embodiment of the present invention is characterized by the two REF-ACT comparison circuits, that is to say, by the REF-ACT comparison circuit 4a for addresses and the REF-ACT comparison circuit 4b for commands.

Now, the structure of the REF-ACT comparison circuits 4a and 4b will be described.

Figure 2:
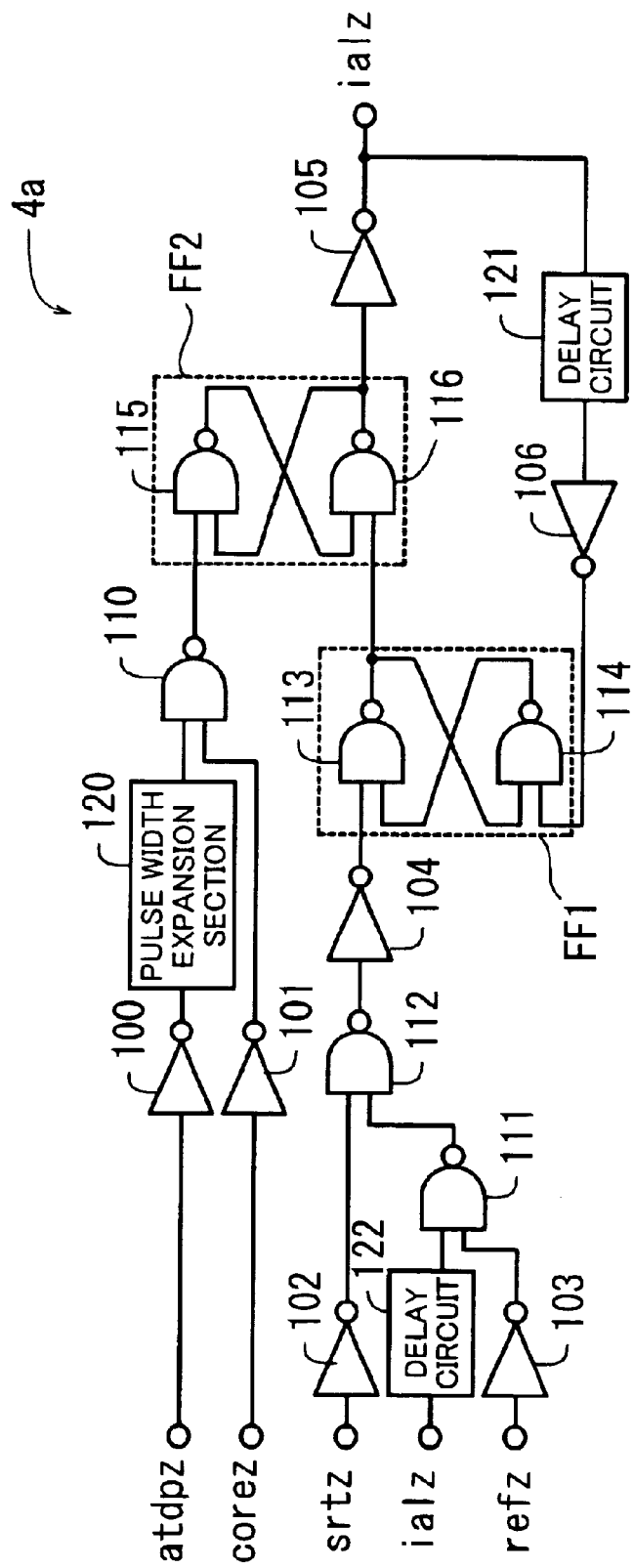
FIG. 2 is a circuit diagram of a REF-ACT comparison circuit for addresses.

FIG. 2 is a circuit diagram of the REF-ACT comparison circuit for addresses.

The REF-ACT comparison circuit 4a includes inverters 100 through 106, NAND circuits 110 through 116, a pulse width expansion section 120, and delay circuits 121 and 122. The NAND circuits 113 and 114 make up a flip-flop FF1 and the NAND circuits 115 and 116 make up a flip-flop FF2. The flip-flop FF2 has the function of comparing an active request and a refresh request. An active request signal atdpz is input to the pulse width expansion section 120 via the inverter 100. The pulse width of the active request signal atdpz is expanded here so that a period during which the active request signal atdpz is at the H level will match a period during which a core control signal corez output from the core control circuit 11 is at the H level. Then the active request signal atdpz is input to one input terminal of the NAND circuit 110. On the other hand, the core control signal corez is input to the other input terminal of the NAND circuit 110 via the inverter 101.

A refresh request signal srtz is input to one input terminal of the NAND circuit 112 via the inverter 102. A refresh address import signal ialz is delayed by the delay circuit 122 and is input to one input terminal of the NAND circuit 111. A refresh execution signal refz is input to the other input terminal of the NAND circuit 111 via the inverter 103. Output from the NAND circuit 111 is input to the other input terminal of the NAND circuit 112. Output from the NAND circuit 112 is input via the inverter 104 to one input terminal of the NAND circuit 113 included in the flip-flop FF1. Output from the NAND circuit 113 is input to one input terminal of the NAND circuit 116 included in the flip-flop FF2. Output from the NAND circuit 116, being output from the flip-flop FF2, is output as the refresh address import signal ialz via the inverter 105. Moreover, output from the inverter 105 is delayed by the delay circuit 121 and is input via the inverter 106 to one input terminal of the NAND circuit 114 included in the flip-flop FF1.

The delay circuit 121, inverter 106, and flip-flop FF1 shown in FIG. 2 are used for obtaining predetermined pulse width.

The details of function and operation of the REF-ACT comparison circuit 4a having the above structure will be described later.

Figure 3:
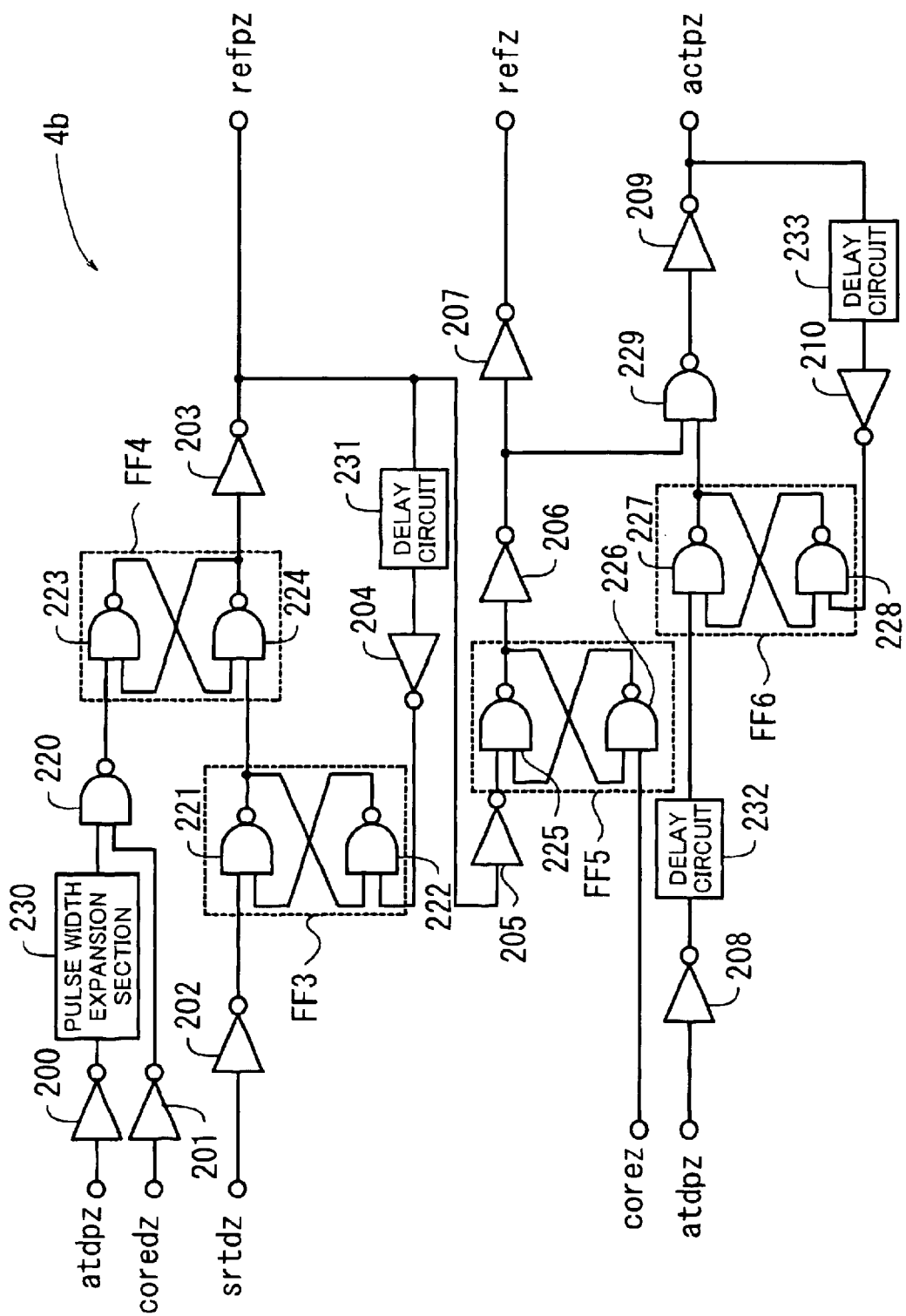
FIG. 3 is a circuit diagram of a REF-ACT comparison circuit for commands.

FIG. 3 is a circuit diagram of the REF-ACT comparison circuit for commands.

The REF-ACT comparison circuit 4b includes inverters 200 through 210, NAND circuits 220 through 229, a pulse width expansion section 230, and delay circuits 231 through 233. The NAND circuits 221 and 222, 223 and 224, 225 and 226, and 227 and 228 make up flip-flops FF3, FF4, FF5, and FF6 respectively. The flip-flop FF4 has the function of comparing an active request and a refresh request. An active request signal atdpz is input to the pulse width expansion section 230 via the inverter 200. The pulse width of the active request signal atdpz is expanded here so that a period during which the active request signal atdpz is at the H level will match a period during which a delayed core control signal coredz, which is output from the core control circuit 11 and which is delayed by the delay circuit 5b shown in FIG. 1, is at the H level. Then the active request signal atdpz is input to one input terminal of the NAND circuit 220. On the other hand, the delayed core control signal coredz is input to the other input terminal of the NAND circuit 220 via the inverter 201.

A delayed refresh request signal srtdz delayed by the delay circuit 5a shown in FIG. 1 is input via the inverter 202 to one input terminal of the NAND circuit 221 included in the flip-flop FF3. Output from the NAND circuit 221 is input to one input terminal of the NAND circuit 224 included in the flip-flop FF4. Output from the NAND circuit 224, being output from the flip-flop FF4, is output as a refresh execution request signal refpz via the inverter 203. Moreover, output from the inverter 203 is delayed by the delay circuit 231 and is input via the inverter 204 to one input terminal of the NAND circuit 222 included in the flip-flop FF3.

The output from the inverter 203 is also input via the inverter 205 to one input terminal of the NAND circuit 225 included in the flip-flop FF5. A core control signal corez output from the core control circuit 11 is input to one input terminal of the NAND circuit 226 included in the flip-flop FF5. Output from the NAND circuit 225, being output from the flip-flop FF5, is output as a refresh execution signal refz via the inverters 206 and 207. Moreover, output from the inverter 206 is input to one input terminal of the NAND circuit 229.

The above refresh execution signal ref z is a signal which is at the H level during refresh operation.

The active request signal atdpz is input via the inverter 208 to the delay circuit 232, is delayed by the delay circuit 232, and is input to one input terminal of the NAND circuit 227 included in the flip-flop FF6. Output from the NAND circuit 227, being output from the flip-flop FF6, is input to the other input terminal of the NAND circuit 229. Output from the NAND circuit 229 is output as an active execution request signal actpz via the inverter 209. Moreover, output from the inverter 209 is input to the delay circuit 233, is delayed by the delay circuit 233, and is input via the inverter 210 to one input terminal of the NAND circuit 228 included in the flip-flop FF6.

The delay circuit 231, inverter 204, and flip-flop FF3 shown in FIG. 3 are used for obtaining predetermined pulse width. The same applies to the delay circuit 233, inverter 210, and flip-flop FF6.

Figure 8:
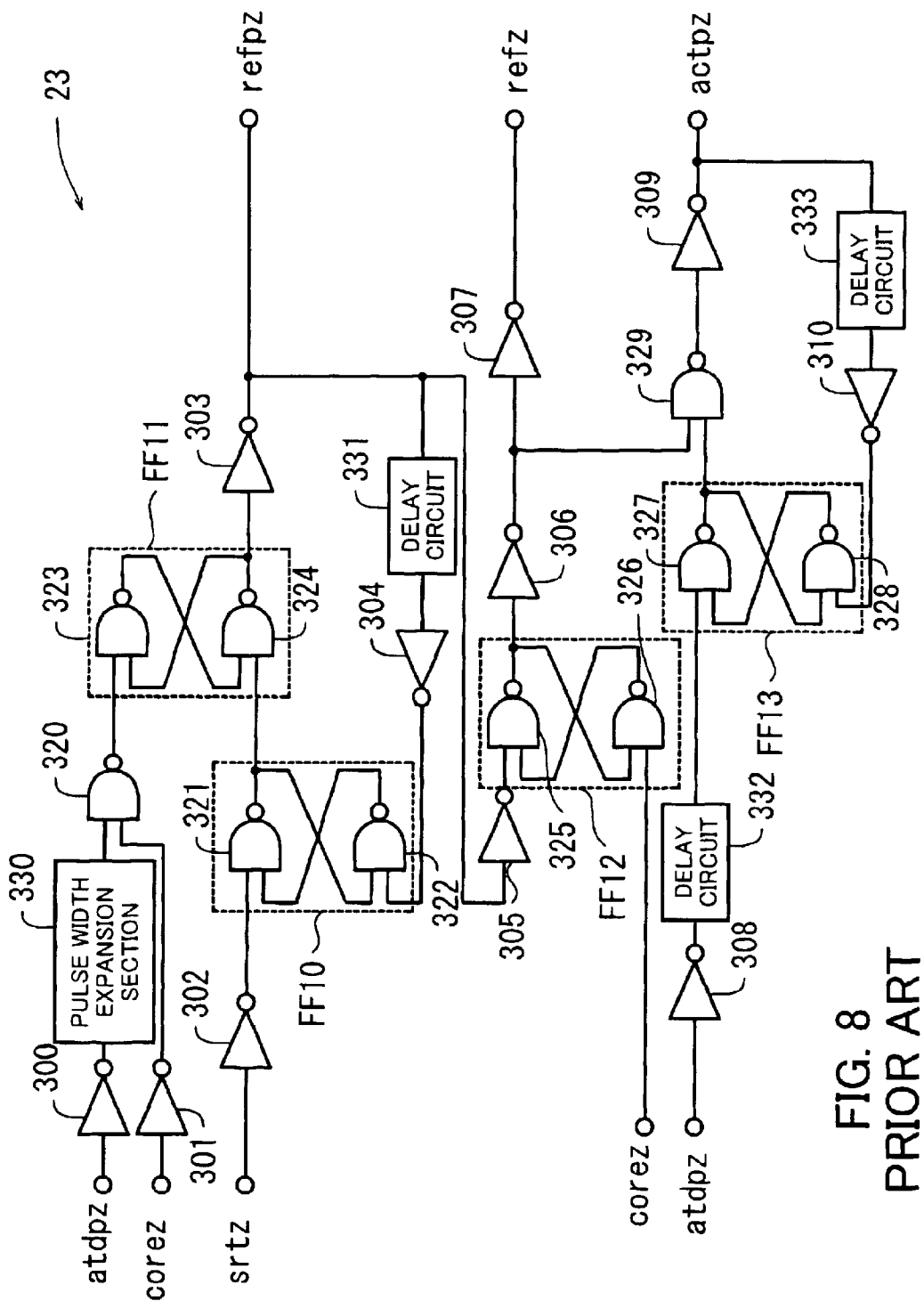
FIG. 8 is a circuit diagram of a conventional REF-ACT comparison circuit.
Figure 9:
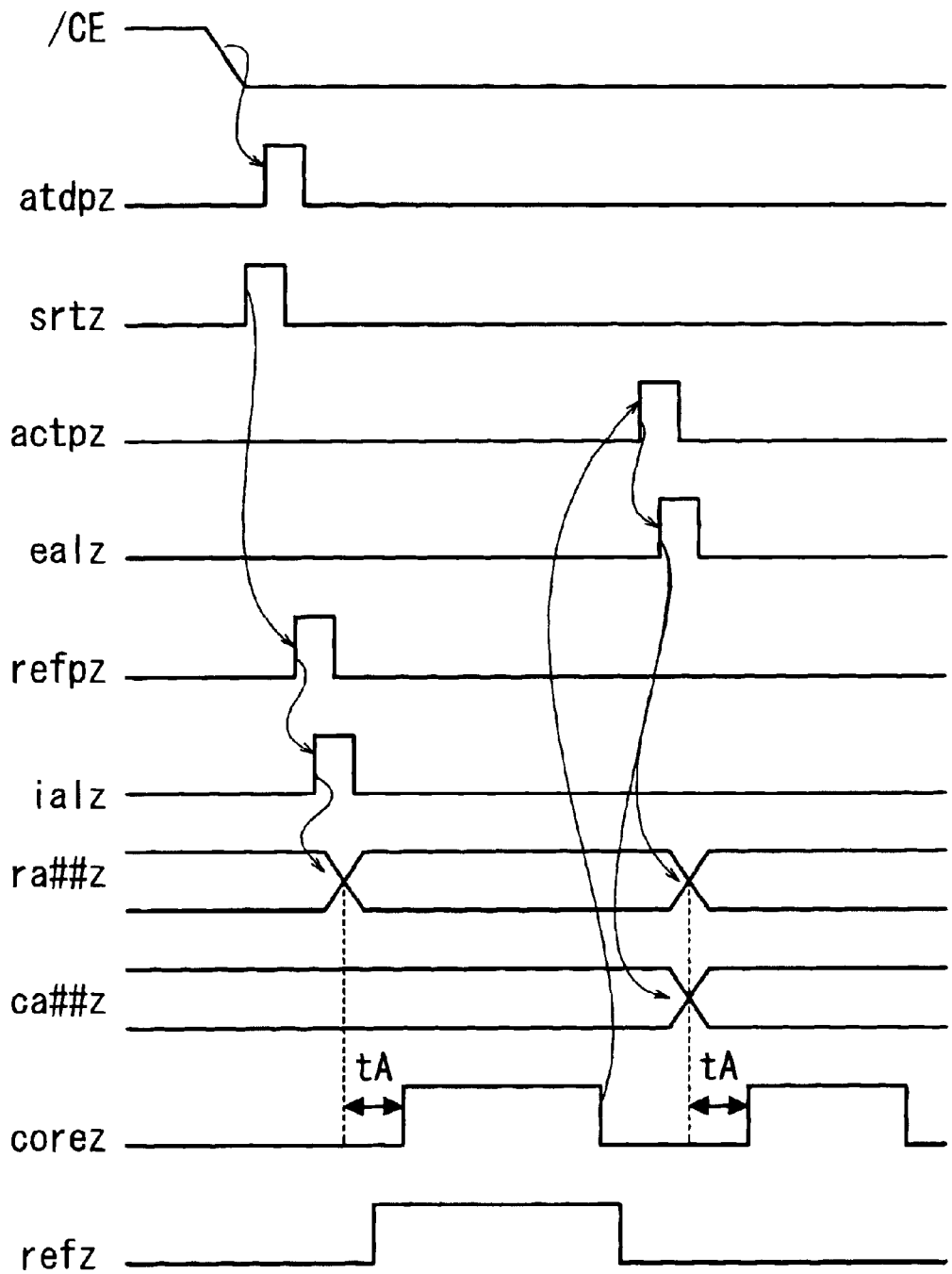
FIG. 9 is a timing chart for describing operation performed in the conventional semiconductor memory in the case of refresh operation being performed prior to active operation.
Figure 10:
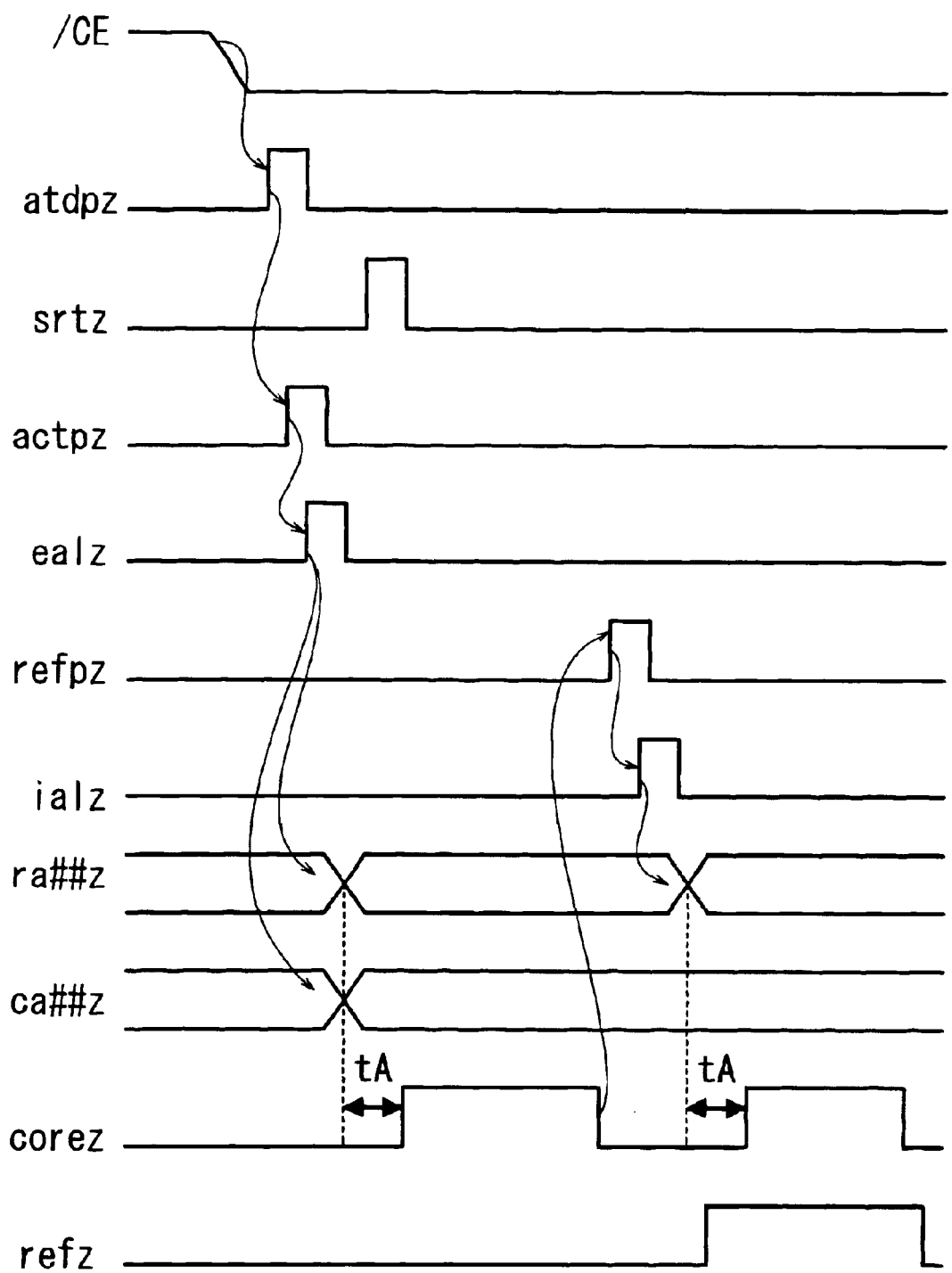
FIG. 10 is a timing chart for describing operation performed in the conventional semiconductor memory in the case of active operation being performed prior to refresh operation.

The structure of the REF-ACT comparison circuit 4b for commands in the semiconductor memory 1 according to the embodiment of the present invention is the same as that of the conventional REF-ACT comparison circuit 23 shown in FIG. 8. With the REF-ACT comparison circuit 4b, however, a delayed refresh request signal srtdz obtained by delaying a refresh request signal srtz by time taken to define an internal address for refresh operation is input instead of the refresh request signal srtz. Furthermore, a delayed core control signal coredz obtained by delaying a core control signal corez by time taken to define an internal address for refresh operation is input to the inverter 201 instead of the core control signal corez.

Now, operation performed in the semiconductor memory 1 according to the embodiment of the present invention will be described by the use of FIGS. 1 through 3.

Figure 4:
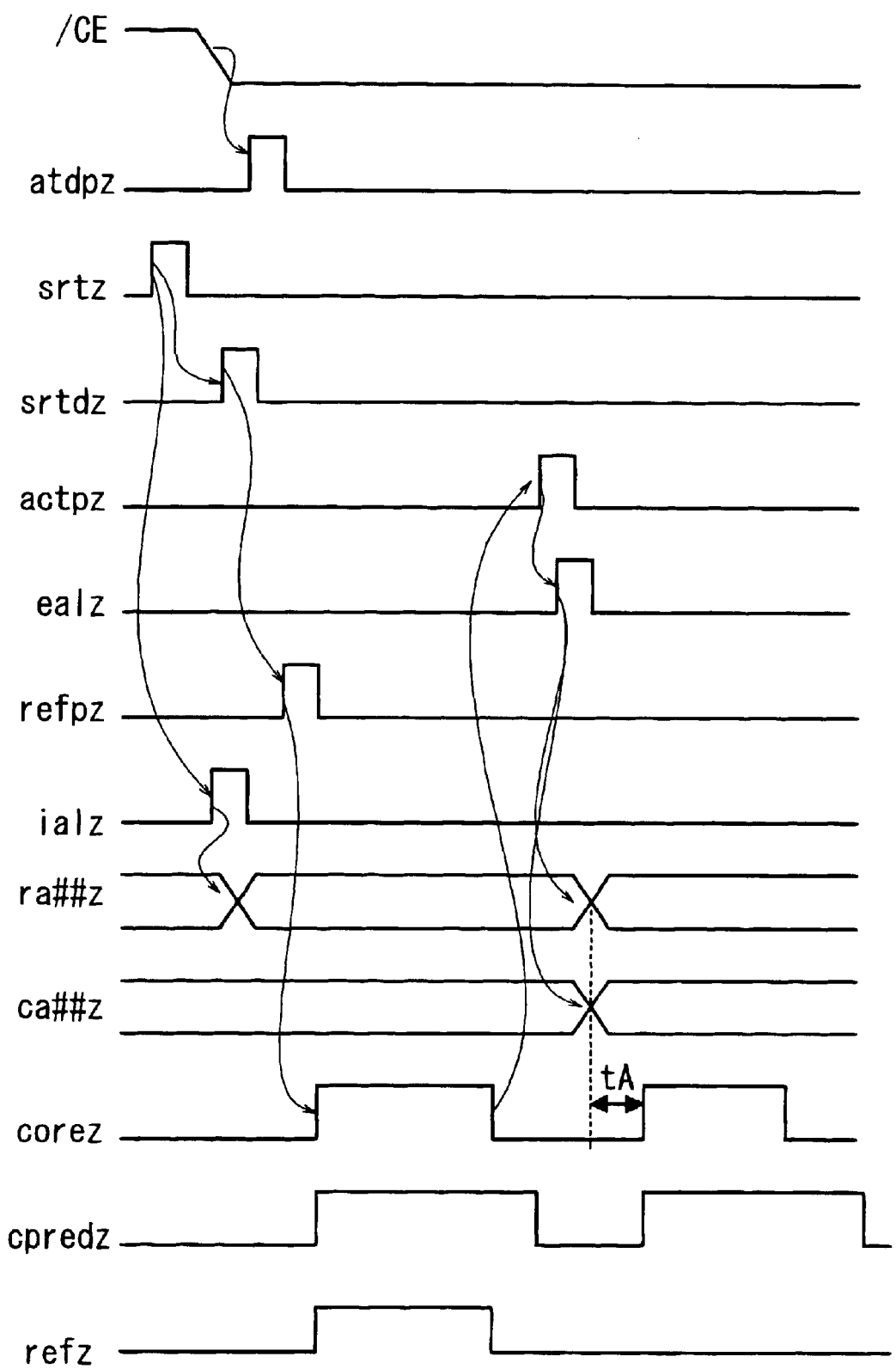
FIG. 4 is a timing chart for describing operation performed in the semiconductor memory according to the embodiment of the present invention in the case of refresh operation being performed prior to active operation.

FIG. 4 is a timing chart for describing operation performed in the semiconductor memory according to the embodiment of the present invention in the case of refresh operation being performed prior to active operation.

Each arrow in FIG. 4 indicates a signal which changes in response to the rise or fall of another signal.

For example, when a chip enable signal /CE, being an external signal, is input to the ATD generation circuit 2, the ATD generation circuit 2 generates an active request signal atdpz. As shown in FIG. 4, in this case, the REF control circuit 3 generates a refresh request signal srtz and a delayed refresh request signal srtdz before the active request signal atdpz is generated. The refresh request signal srtz and active request signal atdpz are input to the REF-ACT comparison circuit 4a for addresses. Moreover, a delayed refresh request signal srtdz delayed by the delay circuit 5a and an active request signal atdpz are input to the REF-ACT comparison circuit 4b for commands.

The refresh request signal srtz is at the H level, so potential at one input terminal of the NAND circuit 116 included in the flip-flop FF2 in the REF-ACT comparison circuit 4a becomes the H level. When the refresh request signal srtz goes into the H level, the active request signal atdpz and a core control signal corez are at the L level. As a result, potential at one input terminal of the NAND circuit 115 included in the flip-flop FF2 becomes the L level. Therefore, output from the flip-flop FF2 goes into the L level and a refresh address import signal ialz goes into the H level.

When the refresh address import signal ialz goes into the H level, the row-add latch circuits 9 import a refresh address rfa##z from the REF-add counters 7 and specify a row address ra##z in the core circuit 12 where data is refreshed.

When the delayed refresh request signal srtdz is input to the REF-ACT comparison circuit 4b (when the delayed refresh request signal srtdz is at the H level), potential at one input terminal of the NAND circuit 224 included in the flip-flop FF4 in the REF-ACT comparison circuit 4b becomes the H level. As shown in FIG. 4, the active request signal atdpz and delayed core control signal coredz are at the L level when the delayed refresh request signal srtdz rises. As a result, potential at one input terminal of the NAND circuit 223 included in the flip-flop FF4 becomes the L level. Therefore, output from the flip-flop FF4 goes into the L level and a refresh execution request signal refpz goes into the H level. When the refresh execution request signal refpz goes into the H level, the core control circuit 11 puts the core control signal corez into the H level and accesses the row address ra##z corresponding to the refresh address rfa##z specified in advance to perform refresh operation.

As shown in FIG. 4, it is assumed that the active request signal atdpz goes into the H level by the chip enable signal /CE just after the delayed refresh request signal srtdz being generated. If refresh operation is being performed and the core control signal corez is at the H level, a refresh execution signal refz and active execution request signal actpz are kept at the H and L levels respectively, as can be understood from FIG. 3. If the refresh execution request signal refpz goes into the L level and the core control signal corez goes into the L level, output from the flip-flop FF5 goes into the L level when the core control signal corez falls. As a result, the refresh execution signal refz goes into the L level and the refresh operation terminates. Both the input terminals of the NAND circuit 229 go into the H level. As a result, the active execution request signal actpz goes into the H level. When the active execution request signal actpz goes into the H level, the latch signal generation circuit 6 outputs an external address import signal ealz. As a result, an external address a##z is imported from the input buffers 8 to the row-add latch circuits 9 and column-add latch circuits 10. Moreover, the active execution request signal actpz is delayed by the delay circuit 5c by time tA (several nanoseconds) taken to define an internal address in the core circuit 12. Then the core control signal corez is put into the H level and a memory cell (not shown) specified by a row address ra##z and column address ca##z is accessed to perform active operation, such as writing or reading.

Refresh operation is performed in the above way. That is to say, when the refresh request signal srtz goes into the H level, the refresh address import signal ialz is put immediately into the H level, the refresh address rfa##z is imported, and the row address ra##z is specified. When the refresh execution request signal refpz goes into the H level, the core control signal corez is put immediately into the H level and refresh operation is performed. Therefore, refresh operation can be performed quickly.

Figure 5:
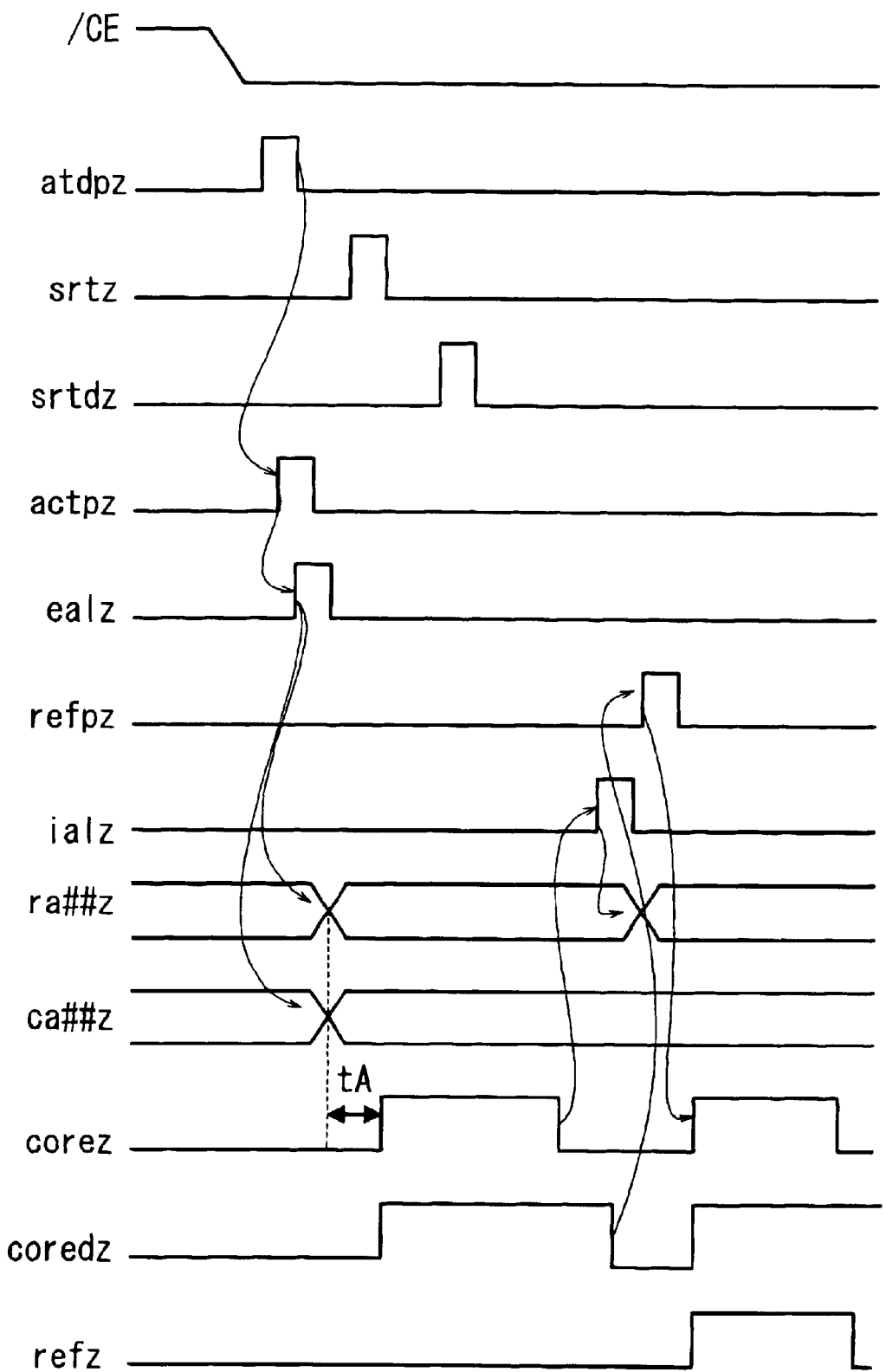
FIG. 5 is a timing chart for describing operation performed in the semiconductor memory according to the embodiment of the present invention in the case of active operation being performed prior to refresh operation.

FIG. 5 is a timing chart for describing operation performed in the semiconductor memory according to the embodiment of the present invention in the case of active operation being performed prior to refresh operation.

Each arrow in FIG. 5 indicates a signal which changes in response to the rise or fall of another signal.

For example, when a chip enable signal /CE, being an external signal, is input to the ATD generation circuit 2, the ATD generation circuit 2 generates an active request signal atdpz. As shown in FIG. 5, in this case, the ATD generation circuit 2 generates the active request signal atdpz before a refresh request signal srtz is generated. The refresh request signal srtz, the active request signal atdpz, and a core control signal corez are input to the REF-ACT comparison circuit 4a for addresses. Moreover, a delayed refresh request signal srtdz delayed by the delay circuit 5a is input to the REF-ACT comparison circuit 4b for commands.

When the active request signal atdpz is input to the REF-ACT comparison circuit 4a, potential at one input terminal of the NAND circuit 115 included in the flip-flop FF2 shown in FIG. 2 becomes the H level. At this time potential at one input terminal of the NAND circuit 116 included in the flip-flop FF2 becomes the L level, so output from the flip-flop FF2 goes into the H level. As a result, a refresh address import signal ialz goes into the L level.

On the other hand, when the active request signal atdpz is input to the REF-ACT comparison circuit 4b (when the active request signal atdpz goes into the H level), potential at one input terminal of the NAND circuit 223 included in the flip-flop FF4 shown in FIG. 3 becomes the H level and potential at one input terminal of the NAND circuit 224 included in the flip-flop FF4 becomes the L level. As a result, output from the flip-flop FF4 becomes the H level. A refresh execution request signal refpz therefore goes into the L level. The core control signal corez is at the L level. Accordingly, output from the flip-flop FF5 becomes the L level and a refresh execution signal refz is kept at the L level. Output from the inverter 206 is at the H level and potential at one input terminal of the NAND circuit 227 included in the flip-flop FF6 becomes the L level. As a result, output from the flip-flop FF6 becomes the H level and output from the NAND circuit 229 becomes the L level. An active execution request signal actpz therefore goes into the H level.

When the active execution request signal actpz goes into the H level, the latch signal generation circuit 6 generates an external address import signal ealz. As a result, an external address a##z is imported from the input buffers 8 and the row-add latch circuits 9 and column-add latch circuits 10 specify a row address ra##z and column address ca##z respectively. Moreover, the active execution request signal actpz is delayed by the delay circuit 5c by time tA taken to define an internal address in the core circuit 12, and is input to the core control circuit 11. When the core control circuit 11 receives the active execution request signal actpz, the core control circuit 11 generates the core control signal corez, accesses a memory cell (not shown) in the core circuit 12 specified by the row address ra##z and column address ca##z, and performs active operation, such as reading or writing. The above operation is the same as that performed in the conventional semiconductor memory 20. With the semiconductor memory 1 according to the embodiment of the present invention, the following operation will be performed after active operation is completed.

As shown in FIG. 5, it is assumed that the refresh request signal srtz is input (the refresh request signal srtz goes into the H level) just after the active request signal atdpz being generated. Active operation is completed and the core control signal corez goes into the L level. When the core control signal corez falls, a refresh address rfa##z is imported.

To be concrete, potential at one input terminal of the NAND circuit 116 included in the flip-flop FF2 in the REF-ACT comparison circuit 4a shown in FIG. 2 is kept at the H level and the core control signal corez goes into the L level. When the core control signal corez falls, potential at one input terminal of the NAND circuit 115 becomes the L level. As a result, output from the flip-flop FF2 goes into the L level and the refresh address import signal ialz goes into the H level. A refresh address rfa##z therefore is imported.

On the other hand, a delayed core control signal coredz obtained by delaying the fall of the core control signal corez by the delay circuit 5b is input to the REF-ACT comparison circuit 4b shown in FIG. 3, because time to determine an internal address in the core circuit 12 is needed. Therefore, when the delayed core control signal coredz falls, the REF-ACT comparison circuit 4b outputs the refresh execution request signal refpz. The core control circuit 11 generates the core control signal corez, accesses a memory cell (not shown) at a row address ra##z which has already been specified, and performs refresh operation.

With the semiconductor memory 1 according to the embodiment of the present invention, an active request signal atdpz may be input between a refresh request signal srtz and a delayed refresh request signal srtdz.

Figure 6:
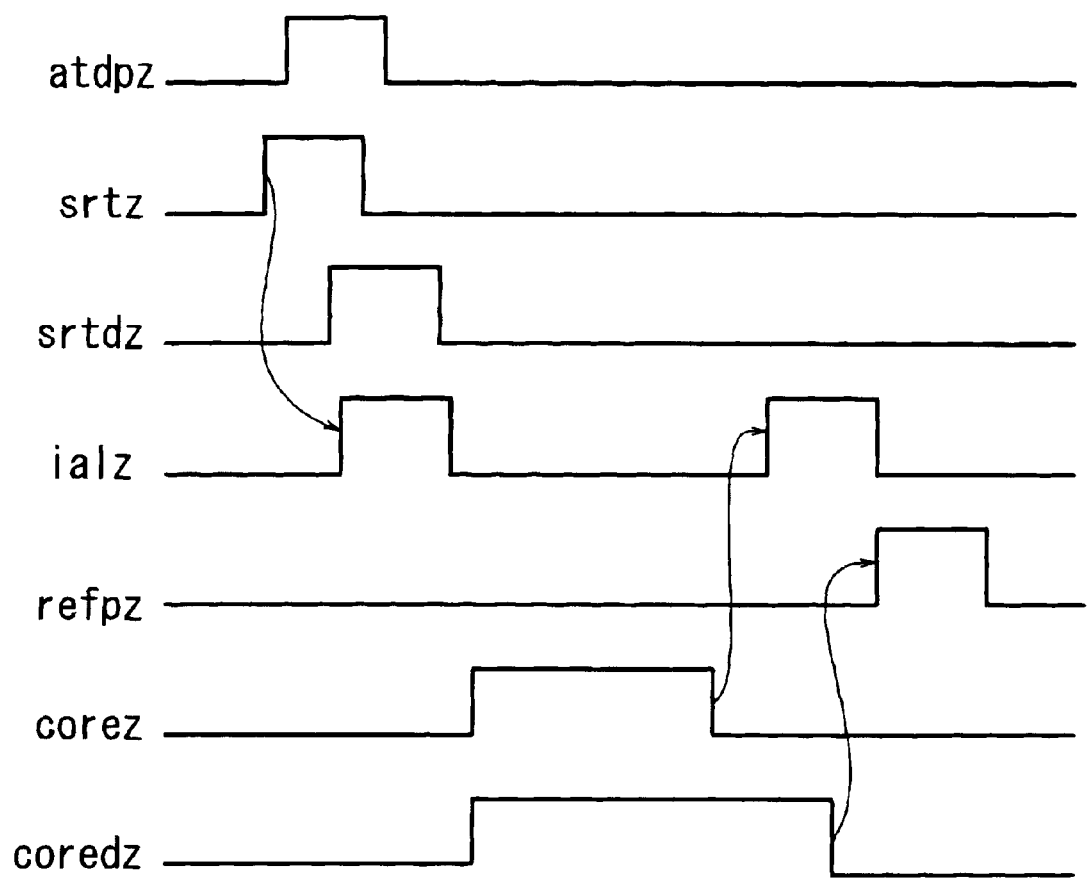
FIG. 6 is a timing chart on which an active request signal is input between a refresh request signal and a delayed refresh request signal.
Figure 7:
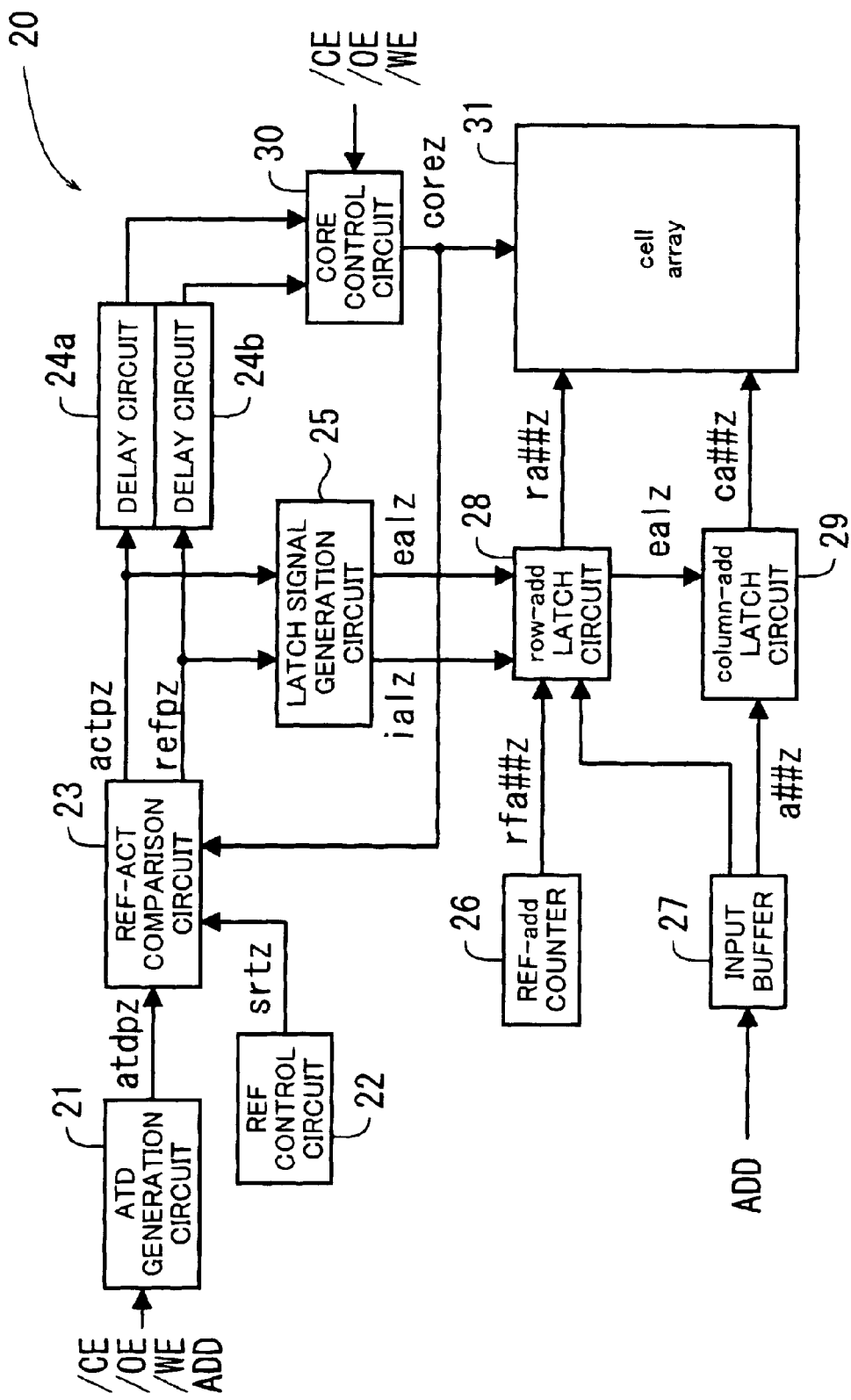
FIG. 7 is a view showing the structure of a conventional semiconductor memory of a pseudo SRAM type.

FIG. 6 is a timing chart on which an active request signal is input between a refresh request signal and a delayed refresh request signal.

In the case of FIG. 6, a refresh request signal srtz is input prior to an active request signal atdpz. Accordingly, as described above, the REF-ACT comparison circuit 4a for addresses outputs are fresh address import signal ialz. However, the active request signal atdpz is input prior to a delayed refresh request signal srtdz. The REF-ACT comparison circuit 4b for commands compares these two signals. Therefore, active operation corresponding to the active request signal atdpz input earlier will be selected and an active execution request signal actpz will be output. As a result, a refresh address rfa##z which has already been imported will be erased. As shown in FIG. 2, the REF-ACT comparison circuit 4a for addresses includes the inverter 103, the NAND circuits 111 and 112, and the delay circuit 122. Consequently, if refresh operation is not performed (a refresh execution signal refz is at the L level) in spite of a refresh address import signal ialz having been output (in spite of a refresh address import signal ialz being at the H level), potential at one input terminal of the NAND circuit 116 included in the flip-flop FF2 is put into the H level and the refresh address import signal ialz is output again when a core control signal corez falls to the L level after active operation being completed.

As stated above, a refresh address rfa##z can be imported immediately in the case of a refresh request being made and refresh operation can be performed immediately in the case of a refresh execution request being made. A quick process therefore can be performed.

The present invention is not limited to the above embodiment. Various modifications will exist within the scope of the claims.

As has been described in the foregoing, the semiconductor memory according to the present invention comprises a first comparison circuit for comparing a refresh request signal internally generated and an active request signal input from the outside and for immediately outputting a refresh address import signal in the case of the refresh request signal having been generated prior to the active request signal and a second comparison circuit for comparing a delayed refresh request signal obtained by delaying the refresh request signal by predetermined time and the active request signal, for outputting a refresh execution request signal in the case of the delayed refresh request signal having been input prior to the active request signal, and for outputting an active execution request signal in the case of the active request signal having been input prior to the delayed refresh request signal. Therefore, when a refresh request signal goes into the H level, a refresh address import signal is put immediately into the H level, a refresh address is imported, and a row address is specified. When a refresh execution request signal goes into the H level, a core control signal is put immediately into the H level and refresh operation is performed. This enables quick refresh operation.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A dynamic semiconductor memory having an asynchronous static semiconductor memory interface, the dynamic semiconductor memory comprising:

a first comparison circuit for comparing a refresh request signal generated internally for performing refresh operation and an active request signal input from the outside for performing active operation and for immediately outputting a refresh address import signal in the case of the refresh request signal having been generated prior to the active request signal; and a second comparison circuit for comparing a delayed refresh request signal obtained by delaying the refresh request signal by predetermined time and the active request signal, for outputting a refresh execution request signal in the case of the delayed refresh request signal having been input prior to the active request signal, and for outputting an active execution request signal in the case of the active request signal having been input prior to the delayed refresh request signal.

2. The semiconductor memory according to claim 1, wherein if the active request signal exists between the refresh request signal and the delayed refresh request signal, the first comparison circuit outputs the refresh address import signal again after the active operation is completed.

3. The semiconductor memory according to claim 1, wherein if the refresh request signal is generated in the course of the selection of the active operation, the first comparison circuit outputs the refresh address import signal after the active operation is completed.

4. The semiconductor memory according to claim 1, wherein if the refresh request signal is generated in the course of the selection of the active operation, the second comparison circuit delays the refresh execution request signal by the predetermined time after the active operation being completed and outputs the refresh execution request signal.

5. The semiconductor memory according to claim 1, wherein the predetermined time is time taken to define an internal address.

* * * * *